:::
United States Patent [19]
Naeem et al.

[11] Patent Number: 5,976,986
[45] Date of Patent: Nov. 2, 1999

[54] LOW PRESSURE AND LOW POWER $Cl_2/HCl$ PROCESS FOR SUB-MICRON METAL ETCHING

[75] Inventors: Munir D. Naeem, Poughkeepsie, N.Y.; Stuart M. Burns, Ridgefield, Conn.; Rosemary Christie, Newburgh, N.Y.; Virinder Grewal, Fishkill, N.Y.; Walter W. Kocon, Wappingers Falls, N.Y.; Masaki Narita, Yokohama, Japan; Bruno Spuler, Munich, Germany; Chi-Hua Yang, Yorktown, N.Y.

[73] Assignees: International Business Machines Corp., Armonk, N.Y.; Siemens Aktiengesellschaft, Munich, Germany; Kabushiki Kaisha Toshiba, Kawaski, Japan

[21] Appl. No.: 08/689,174

[22] Filed: Aug. 6, 1996

[51] Int. Cl.⁶ .................................................. H01L 21/302
[52] U.S. Cl. .......................... 438/714; 438/696; 438/720; 204/192.35
[58] Field of Search ................................... 438/714, 720, 438/696; 204/192.35

[56] References Cited

U.S. PATENT DOCUMENTS

| | | | |
|---|---|---|---|
| 3,994,793 | 11/1976 | Harvilchuck et al. | 216/67 |
| 4,468,284 | 8/1984 | Nelson | 156/643 |
| 5,126,231 | 6/1992 | Levy | 216/67 |
| 5,223,085 | 6/1993 | Kawai et al. | 156/646 |
| 5,259,922 | 11/1993 | Yamano et al. | 438/720 |
| 5,314,603 | 5/1994 | Sugiyama et al. | 204/298.32 |
| 5,387,556 | 2/1995 | Xiaobing et al. | 437/228 |

FOREIGN PATENT DOCUMENTS

| | | |
|---|---|---|
| 63205915 | 8/1988 | European Pat. Off. . |
| 63-205915 | 8/1988 | Japan . |
| WO 96/21243 | 7/1996 | WIPO . |
| WO 97/36322 | 2/1997 | WIPO . |
| 97/36322 | 10/1997 | WIPO . |

OTHER PUBLICATIONS

Yunju Ra, et al., "Etching of Aluminum Alloys in the Transformer–Coupled Plasma Etcher", J. Vac. Sci. Tehchnol. A 12(4), Jul./Aug. 1994, pp. 1328–1333.

*Primary Examiner*—Bruce Breneman
*Assistant Examiner*—Anita Alanko
*Attorney, Agent, or Firm*—Whitham, Curtis & Whitham; Daryl Neff

[57] ABSTRACT

RIE of metallization is achieved at low power and low pressure using $Cl_2$ and $HCl$ as reactant species by creating a transformer coupled plasma with power applied to electrodes positioned both above and below a substrate with metallization thereon to be etched. Three layer metallizations which include bulk aluminum or aluminum alloy sandwiched between barrier layers made from, for example, Ti/TiN, are etched in a three step process wherein relatively lower quantities of $Cl_2$ are used in the plasma during etching of the barrier layers and relatively higher quantities of $Cl_2$ are used during etching of the bulk aluminum or aluminum alloy layer. The ratio of etchants $Cl_2$ and HCl and an inert gas, such as $N_2$ are controlled in a manner such that a very thin side wall layer (10–100 Å) of reaction byproducts created during RIE are deposited on the side walls of trenches formed in the metallization during etching. The side wall layer improves the isotropic nature of the etch such that submicron metallization lines with defect free side walls are formed. Hydrogen ($H_2$) can be added to the plasma and will act to reduce corrosion.

13 Claims, 6 Drawing Sheets

LOW PRESSURE AND LOW POWER Cl$_2$/ HCl PROCESS FOR SUB-MICRON METAL ETCHING

BACKGROUND OF THE INVENTION

1. Field of the Invention

The present invention generally relates to the manufacture of semiconductor devices and circuits and, more particularly, to a process using chlorine (Cl$_2$) and hydrogen chloride (HCl) gases for sub-micron metal etching in a reactive ion etch (RIE).

2. Background Description

Traditional RIE processes use boron chloride (BCl$_3$) and Cl$_2$ chemistries with relatively high source power (500 Watts or more). The historic reason for the use of BCl$_3$ is that the gas, in addition to functioning as an etchant, also performs the function of an oxygen (O$_2$) scavenger in the reactor. In the presence of O$_2$ (or moisture), BCl$_3$ dissociates into B$_2$O$_3$ and Cl$_2$. The drawback of BCl$_3$ is that B$_2$O$_3$ is a source of particulates in the reactor.

For modern high ion density reactors which operate below 15 milliTorr (mT), O$_2$ or moisture scavenging agents are not needed, thus this property of BCl$_3$ is not utilized. Also, high power processes using this approach have certain problems. One of these problems is a high rate of resist erosion and loss of a substantial amount of substrate dielectric, generally silicon dioxide (SiO$_2$). Furthermore, this type of process is more prone to corrosion, and so-called "mouse bites" which are characterized as a lateral loss of Al—Cu (0.5% copper in aluminum) which is not desirable. FIG. 1 is a scanning electron micrograph (SEM) of a "mousebite" and FIG. 2 is an SEM showing an example of corrosion. Corrosion takes place as a result of Cl$_2$ attack on side walls (SW) of etched metal lines in the presence of H$_2$O. A "mousebite" is a form of corrosion which occurs as a result of lack of SW passivation.

In conventional metal etching, the ion density is assumed to control the side wall profile, and high source power (on the order of 500 Watts or more) is a common way of achieving high ion density. U.S. Pat. No. 5,387,556 to Xiaobing et al. discloses a process of etching of aluminum and aluminum alloys using HCl, Cl-containing etchant and nitrogen (N$_2$) that employs conventional capacitatively coupled plasma technology. In capacitatively coupled plasmas, power is provided at either the top or bottom of the chamber, and the plasma acts as a capacitor. Higher power and higher pressures in the chamber leads to higher ion densities. Unfortunately, higher power and pressure leads to greater erosion of the side wall and increased susceptibility to charge damage and corrosion. In addition, Xiaobing et al. utilizes a magnetic field during etching which is not preferable due to the possible exposure to charge damage to the semiconductor devices on the wafer. U.S. Pat. No. 3,994,793 to Harvilchuck et al. also discloses RIE of aluminum utilizing halogen containing etchants, and particularly chlorine, bromine, hydrochloric acid, and carbon tetrachloride. Harvilchuck also teaches the use of a capacitatively coupled plasma, and relies on "sputtering" or "bombarding" of the layer to be etched with chlorine or bromine ions. U.S. Pat. No. 5,223,085 to Kawai discusses anisotropic etching of a layer using plasmas created from hydrogen halides. In Kawai et al., the plasma is created from an electron cyclotron resonance (ECR) source, wherein high power inputs are used to transfer energy to electrons in the plasma by a resonance matching scheme.

SUMMARY OF THE INVENTION

It is therefore an object of this invention to provide a low power and low pressure RIE process that uses Cl$_2$ and HCl gases which produces more vertical side wall profiles in sub-micron aluminum and aluminum alloy etching and reduces corrosion.

It is another object of this invention to provide an etch process that does not use a magnetic field and thereby avoids charge damages caused to devices on a wafer or other substrate.

It is another object of this invention to provide a three step process that employs physical sputtering of titanium based protective or "barrier" layers and chemical etching of bulk aluminum or aluminum alloy layers for multilayer metalizations.

It is yet another object of this invention to provide a control scheme for controlling the ratio of reactant gases in an RIE process that allows the formation of a very thin side wall "passivation" or "polymer" or "deposition" layer that prevents isotropic etching during the etch process, which itself is easily removed by sidewall stripping such that it does not later act as a source of corrosion.

According to the invention, aluminum and aluminum alloys are anisotropically etched by RIE using low power (<350 W) and low pressure (<15 milliTorr (mT)); thereby avoiding sidewall erosion and other problems associated with high power RIE. Use of the low power process also leads to less ultraviolet (UV) hardening of the overlying patterned photoresist used to pattern the aluminum or aluminum alloys during RIE thereby making it more easily removable during resist stripping. Typically, aluminum metallizations used in integrated circuits will have top and bottom barrier layers which sandwich a bulk aluminum or aluminum alloy layer. The top and bottom layers will typically include titanium or titanium alloys, other metals, metal alloys or metal nitrides. These three layer metalizations are patterned according to the present invention using a three step process where in the ratio of reactants are adjusted to achieve a physical type of etching known as sputtering in the top and bottom layers and a chemical etching in the bulk aluminum layer. The sputtering achieves breakthrough of the top barrier layer and reduced undercutting after etching through the bottom barrier layer. This three step process is accomplished simply by reducing chlorine content during etching of the barrier layers, and increasing chlorine content during chemical etching of the bulk aluminum or aluminum alloy. This invention also provides an optimum ratio of reactant gases for RIE of aluminum metallizations whereby etch products such as carbon, titanium compounds, and oxygenated compounds, that are not removed as gaseous byproducts from the plasma chamber create a very fine side wall deposition layer on the trench formed in the metal during etching. The reactant gases include chlorine, HCl, and an inert gas (e.g., nitrogen, argon, helium, etc.). This sidewall deposition is on the order of 10–100 Å thick and has the ability to prevent or reduce isotropic etching of the aluminum or aluminum alloy during RIE, thereby providing well defined side wall profiles. The fine side wall deposition is easily removed by conventional side wall stripping operations (e.g., CF$_4$, oxygen, H$_2$O gas (vapor)). The fine thickness of the SW deposition is an important feature of the invention since SW depositions that are too thick give rise to corrosion as shown in FIG. 2 because a thick SW polymer entraps more Cl$_2$ which attacks metal lines. A thick SW passivation also results in across the chip line width variations (ACLV) for isolated and nested lines. By regulating the thickness of the sidewall deposition layer, ACLV is reduced. The process is corrosion free and produces an etched profile that does not have any "mouse bites". Since corrosion can lead to reduced device yield and reliability, this process gives improved yield and reliability.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
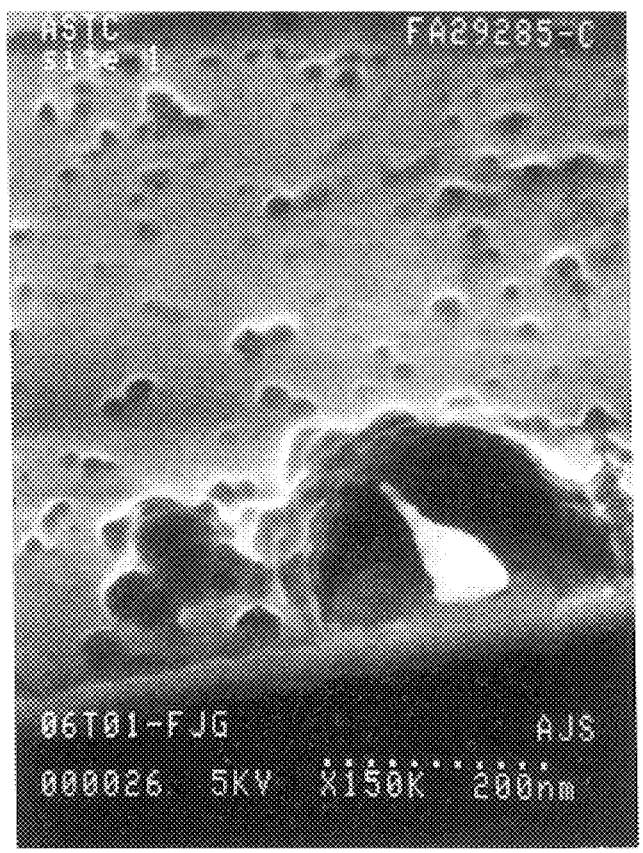
FIG. 1 is an scanning electron micrograph (SEM) showing a typical example of a "mouse bite" (a form of corrosion) in a $BCl_3$ etch.
Figure 2:
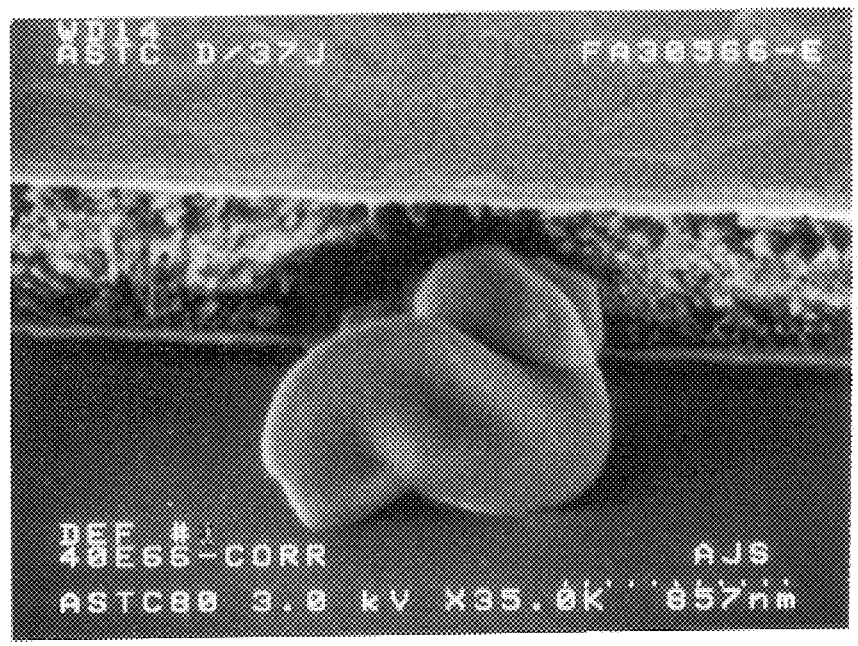
FIG. 2 is an SEM showing an example of corrosion produced in prior processes.

It has been discovered that high power is not required for etching aluminum and aluminum alloys with chlorine and hydrogen chloride when utilizing a transformer coupled plasma (TCP). In TCP, often referred to as "inductively coupled plasma", the efficiency of ionization is better. Power is applied to both the top and bottom electrodes in the etch chamber using different power sources in TCP, and the residence time of electrons in the plasma is typically longer, resulting in more collisions and more ion generation resulting in increased ion density. The electrodes used in TCP can vary and can include coils and the like. TCP is well known in the art, and equipment which utilizes TCP, such as the LAM 9600, are commercially available. However, vendors of equipment which perform TCP recommend high power etching (>500 W), due to past experience with capacitatively coupled plasmas and due to the requirements needed for etching substrates other than aluminum and aluminum alloys (e.g., polyimides and other dielectrics, etc.). Thus, this invention specifically contemplates the ability to etch aluminum and aluminum alloys by RIE using low power (<350 W) and low pressure (<15 milliTorr (mT)).

The process was developed in a LAM 9600 equipment commercially available from Lam Research Corporation, and the typical gas flow rates and low powers used are set forth below in Table 1:

TABLE 1

| Parameter | Value |
| --- | --- |
| Pressure (mT) | 6 to 12 |
| Top Power (Watts (W)) | 50 to 350 |
| Bottom Power (W) | 50 to 350 |
| $Cl_2$ (standard cubic centimeters (sccm)) | 25 to 150 |
| HCl (sccm) | 10 to 100 |
| $N_2$ (sccm) | 0 to 30 |
| Electrode Temp (°C.) | 20 to 70 |
| He Backside Pressure (T) | 4 to 10 |

While Table 1 sets forth an optimum pressure for the etch chamber ranging from 6 to 12, it should be understood that RIE according to this method can be conducted at any pressure less than 15 mT. The "Top Power" parameter is the power that is applied to the top electrode positioned above the substrate to be etched, while the "Bottom Power" parameter is the power that is applied to the bottom electrode positioned below the substrate to be etched. The values of Top and Bottom powers regulate the ion densities in the plasma and the ion impingement energies on the substrate. It should be understood that the Bottom Power can occasionally exceed the Top Power during etching, and that the objective of the etching procedures are to increase ion density in the plasma by prolonging the residence time of electrons in the plasma. Longer residence times for the chlorine ions results in more collisions, increased ion generation, and increased ion density. Variations in the Top and Bottom Powers can be used to vary side wall profile angles of the metallization being etched; however, in the preferred embodiment the Top and Bottom Powers will be adjusted during RIE so as to produce a metal line with vertical side walls in the metallization layer being etched.

While Table 1 presents values for the electrode temperature and backside pressure exerted on the back of the substrate being etched, it should be understood that these values can be varied outside the proposed ranges depending on the application and are not required to practice this invention. The electrode temperature and backside pressure are merely provided to demonstrate that the RIE of this invention can be practiced with low temperatures and pressures; hence, the process is also economical.

Table 1 presents values for the $Cl_2$, HCl, and $N_2$ reactants which aid in the anisotropic nature of the inventive RIE etch process. While nitrogen is used as an inert gas in Table 1, it should be understood that other inert gases such as argon or helium might also be employed; however, results suggest that nitrogen has the advantage of eliminating mouse bites in the end product. The ranges for reactant gases and inert gas have been selected so that non-gaseous byproducts formed during etching which are not pumped out of the reaction chamber will be deposited on and form a thin protective layer on the sidewalls of the trenches as they are formed in the metalization.

Figure 3:
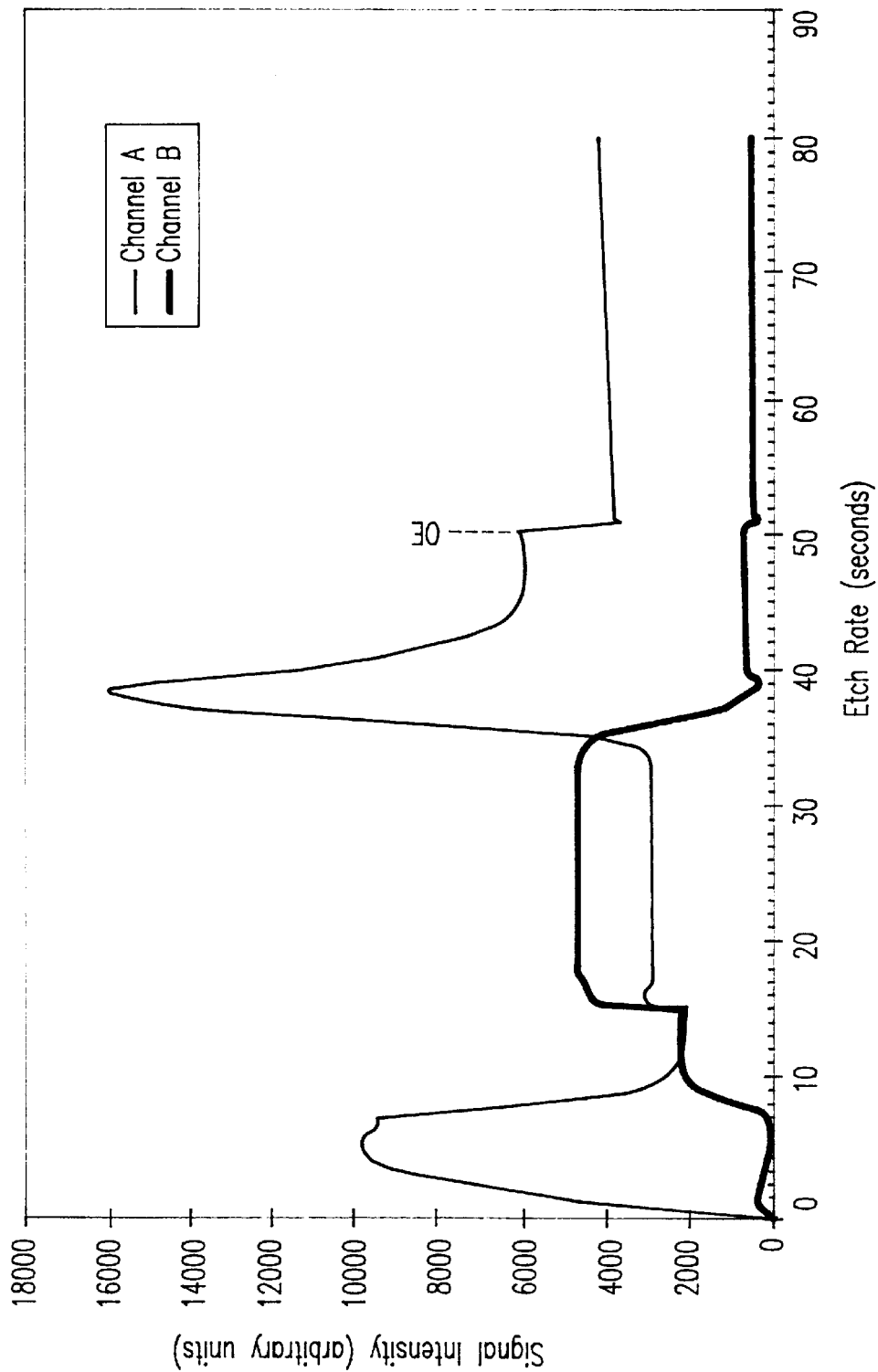
FIG. 3a is a graph showing a typical end point trace for three steps used in the process, namely a "break-through" step to remove a top barrier layer, a "main-etch" step for etching bulk aluminum or aluminum alloy (e.g., AlCu), and an "over etch" step for removing the bottom barrier layer.
FIGS. 3b, 3c and 3d are sequential cross-sectional side views of a three part metallization layer that is etched according to the present invention.
Figure 3B:
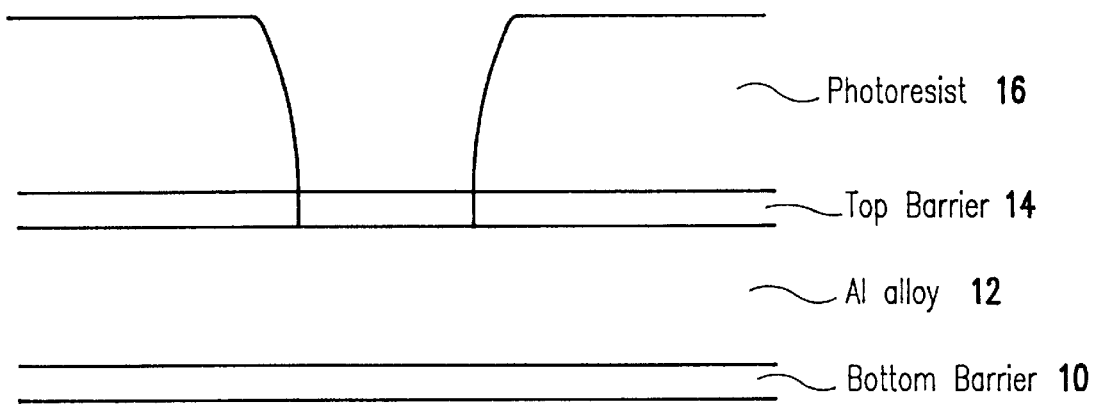
Figure 3C:
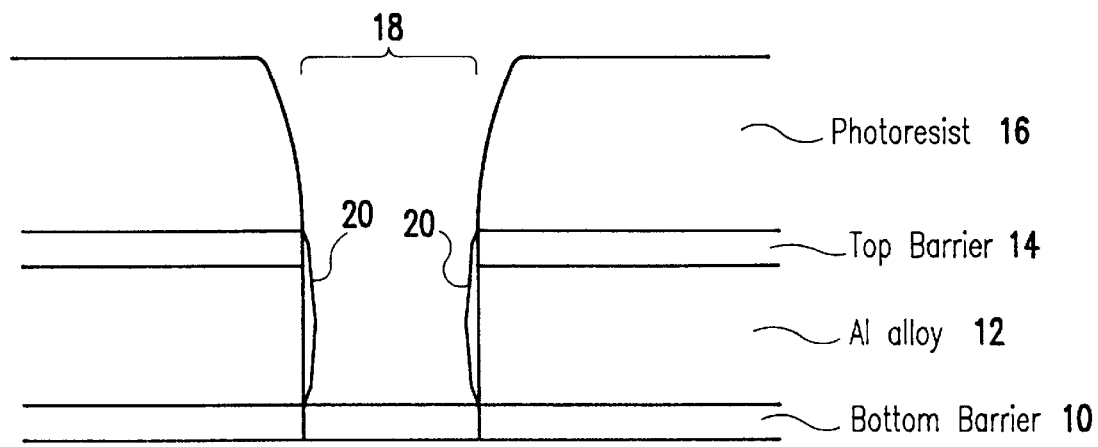
Figure 3D:
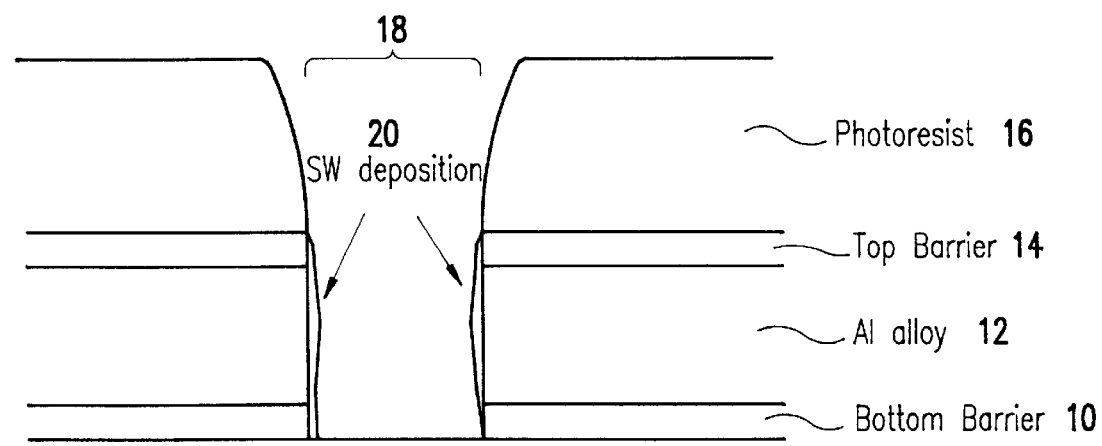

With reference to FIGS. 3b, 3c, and 3d, it can be seen that an aluminum or aluminum alloy metalization typically is comprised of a bottom barrier layer 10, bulk aluminum or aluminum alloy 12, and upper barrier layer 14. The barrier layers 10 and 14 are typically on the order of 5 to 150 nm thick, while the bulk aluminum or aluminum alloy 12 is on the order of 100 to 1500 nm thick. Preferred aluminum alloys include those which have Cu and/or Si at a concentration of 0–5 wt %. A patterned photoresist 16 or other patterned masking material leaves regions 18 exposed. The barrier layers are typically made of titanium or titanium alloy, but can be made of other metals or metal alloys (Me) such as tantulum (Ta), tungsten (W), molybdenum (Mo), chromium (Cr), vanadium (V), niobium (No), zirconium (Zr), rhenium (Re), hafnium (Hf), and metal nitrides (MeN) or metal-silicon nitrides (Me—Si—N). The photoresist 16 can be any of a variety of materials, and it has been that deep UV (DUV) type photoresists or mid UV type photoresists which are patterned using conventional lithography are preferable in the practice of this invention because the selectivity of the ethants for Al—Cu metal relative to photoresist is over 5. Suitable photoresists are commercially available from Hoechst, Shipley, IBM, JSR, and TOK, and include AZ, Apex, JSR, and TOK.

As the metallization is etched, certain byproducts such as aluminum chloride are pumped out of the reaction chamber. However, non-gaseous byproducts which can include carbon or oxygen or titanium or other materials will form a thin deposited film or layer 20 on the sidewalls of the trench which is formed in region 18 as the trench is being formed. These byproducts come from reactions of the photoresist with the etchants, as well as the etching byproducts formed from the barrier layer 14. FIGS. 3c and 3d show deposited layers 20 as the etch proceeds through the entire metallization layup (10, 12, and 14).

A particular advantage of this invention is that magnetic fields are not required or employed during etching. Because magnetic fields are not used, the risk of charge damages caused to devices on a wafer or other substrate is avoided.

A particular aspect of this invention is directed to forming very thin side wall deposition layers 20 on the order of 10–100 Å thick. The thin side wall deposition layers 20 have the advantage of making the etch at region 18 more isotropic since the layers 20 are more resistant to the reactive ions than the bulk material 12 or barrier layers 10 and 14. However, if the deposition layers 20 are too thick, the sidewalls of the trench formed in region 18 will be subject to corrosion because the thicker side walls trap more chlorine which leads to corrosion, and the thicker side walls will also result in increased ACLV.

The ratios of inert gas, chlorine and HCl set forth in Table 1 have been selected through empirical testing to produce deposition layers 20 of 10–100 Å thick under the low pressure conditions set forth in Table 1. In the practice of one aspect of this invention, it is preferred that the gases have a ratio of 25–150:10–100:0–30 for $Cl_2$:HCl:inert gas, and it is most preferred that the gases have a ratio of 50–100:10–35:10–20 for $Cl_2$:HCl:inert gas.

It is also contemplated by this invention that the reactant byproducts could be analyzed simultaneously during etching using spectrophotometry or other detection technologies connected to the etch chamber or conduits leading from the etch chamber, and that the detected reactant byproducts could be used in a feedback control loop to adjust the ratio of $Cl_2$, HCl, and inert gas such that the deposited layers 20 will not be too thick or too thin (e.g., 10–100 Å thick is preferred).

Hydrogen ($H_2$) may also be added to the plasma, preferably in amounts ranging from 0–100 sccm, and can be useful in reducing corrosion. Hydrogen will reduce corrosion by reacting with free chlorine to form a relatively stable HCl product. In addition, $H_2$ also gives a more robust side wall by allowing $SiO_2$ and Si deposition on the side wall.

Figure 4:
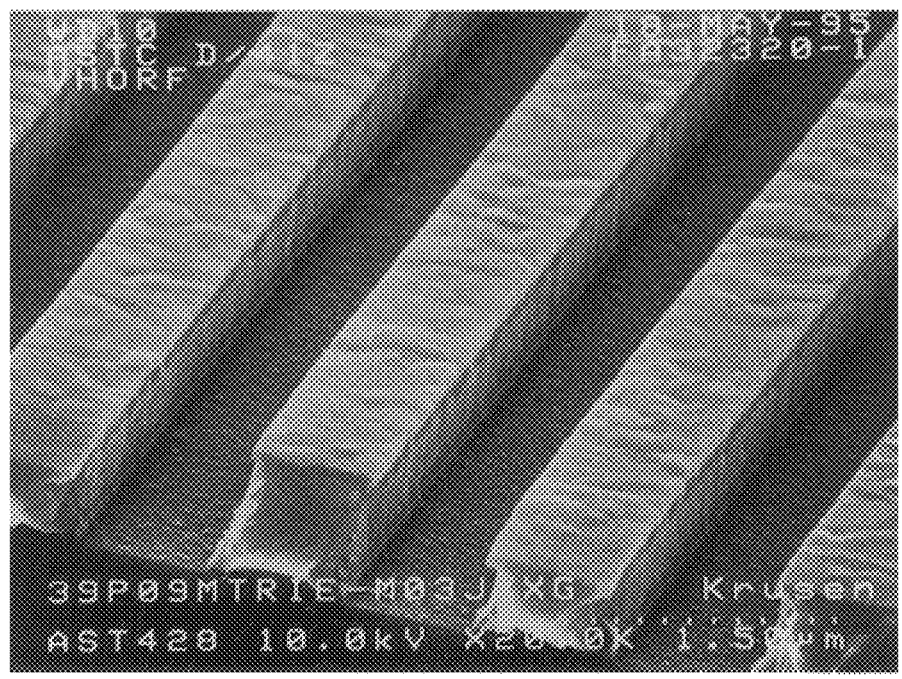
FIG. 4 is an SEM showing corrosion and mouse bite free side walls of metal lines produced by the process of the present invention.
Figure 5:
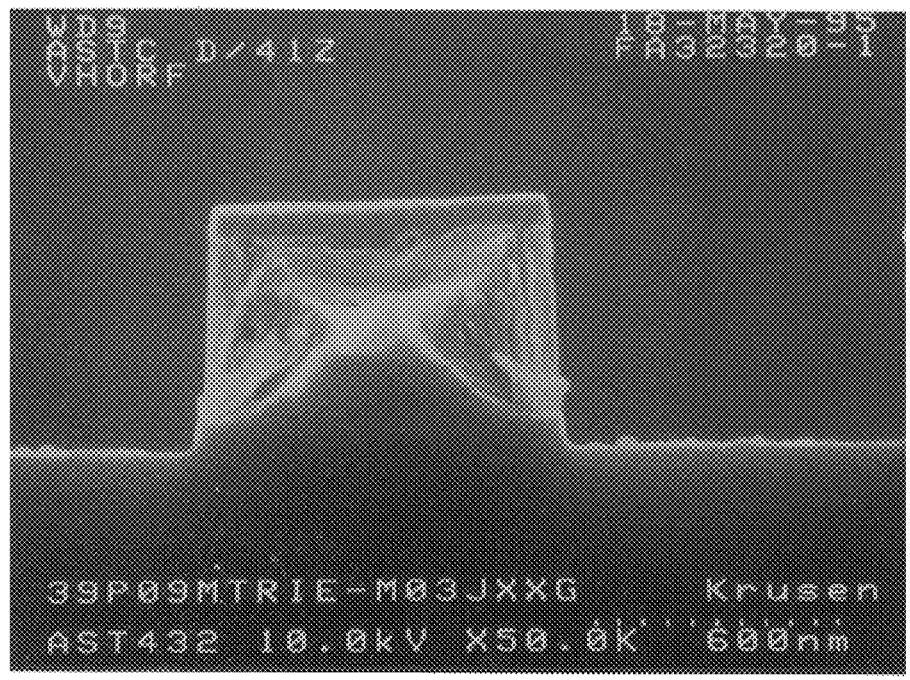
FIG. 5 is an SEM showing side wall profiles of Al—Cu lines after etching.

After etch through of the metallization, the deposited layers 20 can be removed using standard sidewall stripping procedures such as steam treatment ($H_2O$ gas), oxygen plasma, or $CF_4$ treatment. FIGS. 4 and 5 show corrosion and mouse bite free side walls of metal lines and side wall profiles of Al—Cu lines after etching using the inventive etch process, respectively. It can be seen that the etch process produces submicron lines with vertical side walls which have less mouse bites or corrosion that causes across chip line width variation (ACLV).

FIGS. 3a–3d highlight another aspect of this invention wherein the metallization comprised of layers 10, 12, and 14, is etched in essentially three steps. Specifically, the top barrier layer 14, is etched using more of a "physical" sputtering type etch process with ion bombardment. This is accomplished by reducing the $Cl_2$ in the plasma, such that the titanium and/or titanium nitride (Ti/TiN) in the barrier layer 14 is removed mostly by chlorine and HCl ions sputtering actions. For example, the $Cl_2$ can be reduced to 0–120 sccm. The sputtering proceeds for a short period of time (e.g., 5–25 seconds) depending on the thickness of barrier layer 14, and should be of a sufficient duration to break through the barrier layer 14 while at the same time minimizing the erosion of resist 16. The bulk aluminum or aluminum alloy 12 is then selectively etched with all of the reactant gases (e.g., $Cl_2$ at 25–150 sccm). This is more akin to a chemical etch with aluminum being removed as aluminum chloride and other byproducts. Preferably, the amount of $Cl_2$ used for etching the bulk aluminum or aluminum alloy 12 will be greater than used during etching of the barrier layer 14. Selective etching is achieved by virtue of the plasma being more selective to the aluminum or aluminum alloy 12 than the photoresist 16. After the aluminum or aluminum alloy 12 is etched through, the bottom barrier layer 10, which typically will contain Ti/TiN, will be etched by more of a physical type sputtering reaction or "ion bombardment" using a low $Cl_2$ flow rate (e.g., 0–120 sccm) that is preferably reduced from that which is used during etching of the aluminum or aluminum alloy layer. This last step for etching does not affect the side wall profile, and the use of low $Cl_2$ results in minimizing the undercut after etch through.

Detectors which detect aluminum chloride and other reaction byproducts can be used to control raising and lowering the flow rate of $Cl_2$ during etching. Alternatively, the time periods for flowing higher and lower quantities of $Cl_2$ can be empirically determined, and will vary depending upon the thickness of each layer, as well as the pressure conditions used in the RIE chamber. Some process optimization may be required for different metallurgies. FIG. 3a shows a typical endpoint trace from standard optical equipment from a LAM TCP chamber which is a filtered diode, wherein channel A shows high signal intensity during etching of the barrier layers 10 and 14, and channel B shows high signal intensity during etching of the aluminum or aluminum alloy layer 12. Channel A and B are used to detect the emission of reaction byproducts with different wavelengths (A filter=703 nm indicating Cl and Ti excitation state and B filter=261 nm indicating aluminum chloride excitation state).

Figure 6:
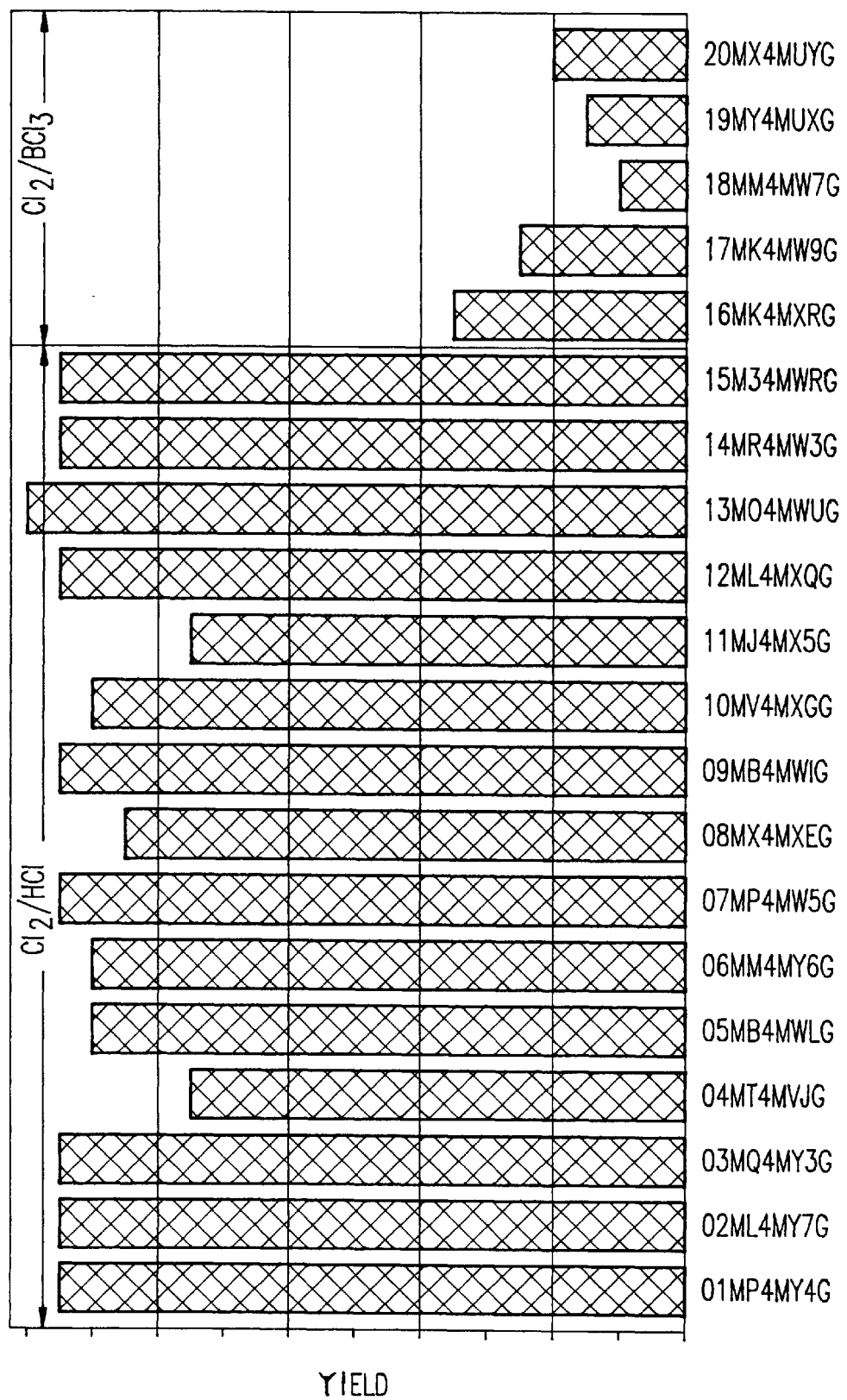
FIG. 6 is a graph showing comparatively better results in terms of electrical shorts yield for lines on wafers made using the process of this invention compared to those obtained with traditional processes.

FIG. 6 shows the metal "shorts" yield for several trials where aluminum lines on wafers were etched using the $C_2$/HCl process of this invention and where aluminum lines on wafers were etched using the traditional $Cl_2$/$BCl_3$ process. This data shows that improved results are obtained when the inventive process is utilized.

Figure 7B:
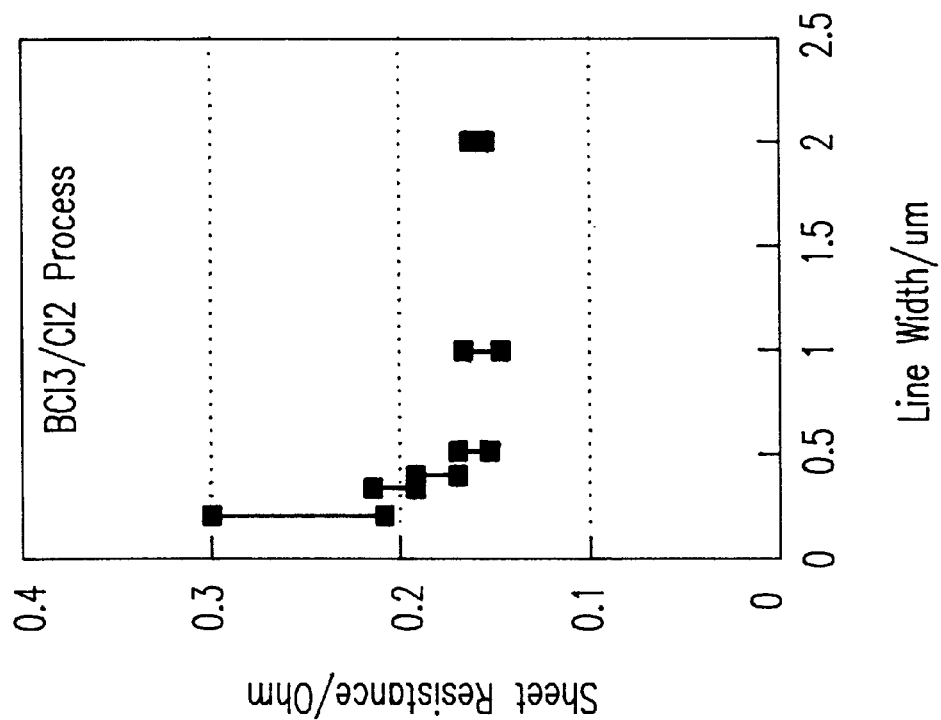
FIGS. 7a and 7b are comparative graphs showing the critical dimension (CD) measured as sheet resistance (electrical bias) showing a tighter distribution for wafers etched with $Cl_2/HCl$ according to the inventive process compared to the traditional $Cl_2/BCl_3$ process.
Figure 7A:
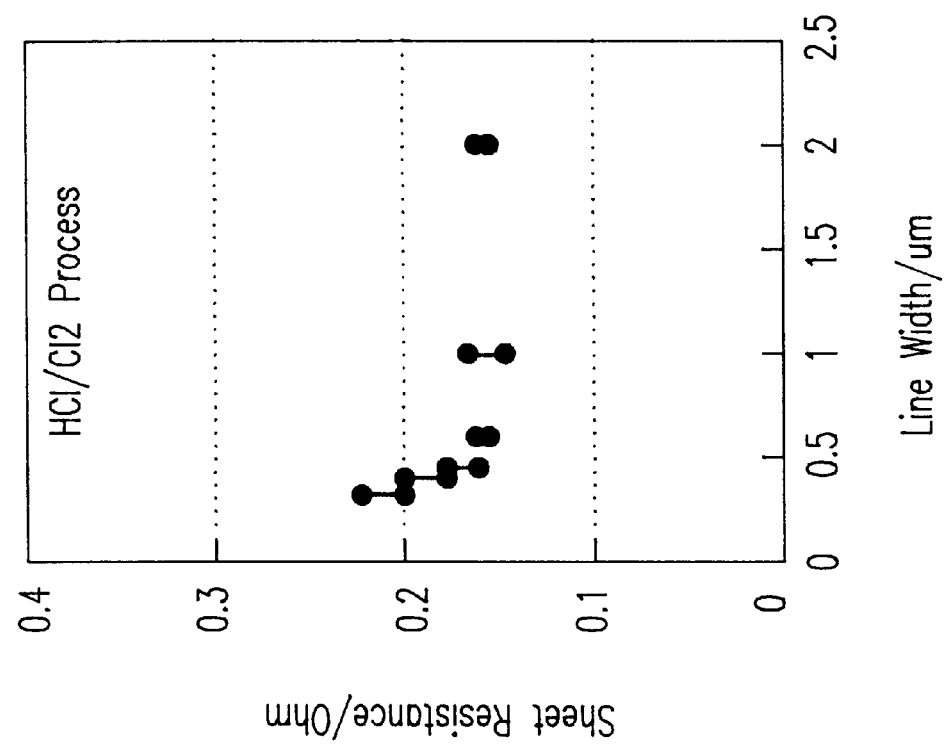

FIGS. 7a and 7b show the sheet resistance or "electrical bias" in Ohms plotted against the line width in $\mu$m for aluminum lines etched with the HCl/$Cl_2$ process of this invention and the $Cl_2$/$BCl_3$ process, respectively. These figures show a relatively tighter distribution is achieved when the HCl/$Cl_2$ process is used.

We claim:

1. A method for patterning aluminum metallization, comprising the steps of:

placing aluminum metallization coated on at least one surface with a barrier layer in an etch chamber, said aluminum metallization being selected from the group consisting of aluminum and aluminum alloys;

creating a transformer coupled plasma from $Cl_2$, HCl, and an inert gas within said etch chamber, without a magnetic field, using separately powered electrodes positioned above and below said aluminum metallization wherein each of said electrodes are powered by less than 350 Watts, and wherein the pressure in said etch chamber is less than 15 milliTorr;

etching said aluminum metallization with ions and radicals formed in said plasma; and adjusting a concentration of said $Cl_2$ in said plasma during said creating and etching steps between a first relatively higher concentration during etching of said is aluminum metallization and a second relatively lower concentration during etching of said barrier layer.

2. The method of claim 1 further comprising the steps of:

applying a patterning material to a top surface of said aluminum metallization; and patterning said patterning material so as to expose regions of said aluminum metallization.

3. The method of claim 2 wherein said patterning material is a photoresist and said patterning step is performed using lithography.

4. The method of claim 1 further comprising the step of selecting said barrier layer from the group of metals, metal nitrides, and metal silicon nitrides, wherein the metals are selected from the group consisting of Ta, Ti, Re, W, Mo, Cr, No, Hf, V, and Zr.

5. A method for patterning aluminum metallization, comprising the steps of;

placing aluminum metallization in an etch chamber, said aluminum metallization being selected from the group consisting of aluminum and aluminum alloys, said aluminum metallization being coated on its top and bottom surfaces with a barrier layer;

creating a transformer coupled plasma from $Cl_2$, HCl, and an inert gas within said etch chamber, without a magnetic field, using separately powered electrodes positioned above and below said aluminum metallization wherein each of said electrodes are powered by less than 350 Watts, and wherein the pressure in said etch chamber is less than 15 milliTorr;

etching said aluminum metallization with ions and radicals formed in said plasma; and adjusting a concentration of said $Cl_2$ in said plasma during said creating and etching steps between a relatively lower concentration during etching of said barrier layer on said top surface, a second relatively higher concentration during etching of said aluminum metallization, and a third relatively lower concentration compared to said second relatively higher concentration during etching of said barrier layer on said bottom surface.

6. The method of claim 5, wherein said first and third relatively lower concentrations are approximately the same.

7. The method of claim 1 further comprising the step of selecting said first electrode positioned above said aluminum metallization to be powered by 50–350 Watts and selecting said second electrode positioned below said aluminum metallization to be powered by 50–350 Watts.

8. The method of claim 7 further comprising the step of adjusting the power of said first and second electrodes during said creating and etching steps.

9. The method of claim 1 further comprising the step of selecting said inert gas to be $N_2$.

10. The method of claim 9 further comprising the step controlling a ratio of said $Cl_2$, HCl, and said $N_2$ to be 25–150:10–100:0–30 for $Cl_2$:HCl:$N_2$.

11. The method of claim 10 wherein said ratio of said $Cl_2$, HCl, and said $N_2$ is 50–100:10–35:10–20 for $Cl_2$:HCl:$N_2$.

12. The method of claim 1 further comprising the step of adding hydrogen to said etch chamber during said creating step.

13. The method of claim 1 further comprising the steps of:

forming side wall layers on trenches formed in said aluminum metallization during said etching step, said side wall layers being formed from etch byproducts produced during said etching step; and controlling the thickness of said side wall layers to range from 10 Å to 100 Å thick.

* * * * *